United States Patent
Mori

(10) Patent No.: US 8,097,914 B2
(45) Date of Patent: Jan. 17, 2012

(54) SEMICONDUCTOR DEVICE AND MANUFACTURING METHOD OF THE SAME

(75) Inventor: Hideki Mori, Kanagawa (JP)

(73) Assignee: Sony Corporation, Tokyo (JP)

( * ) Notice: Subject to any disclaimer, the term of this patent is extended or adjusted under 35 U.S.C. 154(b) by 268 days.

(21) Appl. No.: 12/545,950

(22) Filed: Aug. 24, 2009

(65) Prior Publication Data

US 2010/0052045 A1 Mar. 4, 2010

(30) Foreign Application Priority Data

Aug. 29, 2008 (JP) ................................. 2008-222810

(51) Int. Cl.
*H01L 29/76* (2006.01)
*H01L 29/94* (2006.01)

(52) U.S. Cl. ........ 257/328; 257/329; 257/330; 257/331; 438/268

(58) Field of Classification Search .......... 257/328–331, 257/E29.257, E21.418; 438/268
See application file for complete search history.

(56) References Cited

U.S. PATENT DOCUMENTS

| 6,570,805 B2 * | 5/2003 | McCollum | 365/225.7 |
| 2002/0125482 A1 * | 9/2002 | Friedrichs et al. | 257/73 |

FOREIGN PATENT DOCUMENTS

| JP | 58-222554 | 12/1983 |
| JP | 01-282858 | 11/1989 |
| JP | 06-169062 | 6/1994 |
| JP | 06-232410 | 8/1994 |
| JP | 06-244413 | 9/1994 |
| JP | 08-335522 | 12/1996 |
| JP | 2007-012858 | 1/2007 |
| JP | 2007-036213 | 2/2007 |
| JP | 2007-335844 | 12/2007 |
| JP | 2008-004643 | 1/2008 |
| JP | 2008-016518 | 1/2008 |
| JP | 2008-016562 | 1/2008 |

OTHER PUBLICATIONS

Japanese Patent Office Action corresponding to Japanese Serial No. 2008-222810 dated Mar. 30, 2010.

* cited by examiner

*Primary Examiner* — Theresa T Doan
(74) *Attorney, Agent, or Firm* — SNR Denton US LLP

(57) ABSTRACT

Disclosed herein is a semiconductor device including: a main body transistor region; and an electrostatic discharge protection element region, wherein the main body transistor region includes, a drain region; a drift region; body regions; a gate insulating film; gate electrodes; source regions; channel regions; and potential extraction regions, and the electrostatic discharge protection element region includes, the body regions; the gate insulating film; the gate electrodes; source regions and drain regions; and potential extraction regions, and a gate length in the electrostatic discharge protection element region is equal to or less than twice a channel length in the main body transistor region.

2 Claims, 7 Drawing Sheets

SEMICONDUCTOR DEVICE AND MANUFACTURING METHOD OF THE SAME

BACKGROUND OF THE INVENTION

1. Field of the Invention

The present invention relates to a semiconductor device having a super junction structure and electrostatic discharge protection element, and a manufacturing method of the same.

2. Description of the Related Art

A vertical DMOSFET (Double-diffused Metal Oxide Semiconductor Field Effect Transistor) is commonly known as a high withstand voltage power device for use in high withstand voltage power electronics applications. The vertical DMOSFET provides high withstand voltage thanks to the vertical thickness (depth) of a first conductivity type drift region and the impurity concentration.

For example, a so-called super junction structure is available as a vertical DMOSFET device structure which achieves compatibility between element withstand voltage and low Ron. In this structure, two types of regions, i.e., a first conductivity type drift region and second conductivity type pillar region, are alternately repeated (refer, for example, to Japanese Patent Laid-Open Nos. 2007-335844, 2008-4643, 2008-16518 and 2008-16562).

FIG. 7 illustrates a sectional structural diagram of a vertical DMOSFET having a super junction structure as an example of a semiconductor device of the past. In FIG. 7, a main body transistor (Tr) region 50 and ESD (Electrostatic Discharge) protection element region 60 in a vertical DMOSFET are shown both of which have a super junction structure.

A drift region 52 which includes a first conductivity type (n type) semiconductor region is formed on the main surface of a drain region 51. The drain region 51 includes a first conductivity type semiconductor region having a high impurity concentration ($n^+$ type).

Second conductivity type (p type) pillar regions 53 are formed in the drift region 52. The same regions 53 are arranged periodically in the direction approximately parallel to the main surface of the drain region 51. The drift region 52 and pillar regions 53 form a so-called super junction structure. That is, the drift region 52 and pillar regions 53 are adjacent to each other to form p-n junctions.

Body regions 54 are formed on and in contact with the pillar regions 53. The body regions 54 each include a second conductivity type (p type) semiconductor region. As with the pillar regions 53, the body regions 54 are adjacent to the first conductivity type drift region to form p-n junctions.

Further, a gate insulating film 58 is provided on the drift region 52 and body regions 54.

In the main body Tr region 50, gate electrodes 57 are formed on the gate insulating film 58 in such a manner as to straddle a part of the body regions 54 and a part of the drift region 52.

Further, on the surfaces of the body regions 54, source regions 55 are selectively formed where the end portions of the gate electrodes 57 and those of the source regions 55 overlap each other. The source regions 55 each include a first conductivity type semiconductor region. Still further, on the surfaces of the body regions 54, potential extraction regions (backgates) 56 adapted to extract the potentials of the body regions 54 are formed, each adjacent to the source region 55. The potential extraction regions 56 each include a second conductivity type semiconductor region.

In the ESD protection element region 60, source regions 61 are selectively formed on the surfaces of the body regions 54. The source regions 61 each include a first conductivity type semiconductor region. Further, on the surfaces of the body regions 54, potential extraction regions (backgates) 62 adapted to extract the potentials of the body regions 54 are formed, each with a given spacing from the source region 61. The potential extraction regions 62 each include a second conductivity type semiconductor region.

An input terminal 63 is provided to ensure that the gate electrodes 57 of the main body Tr region 50 and the source regions 61 of the ESD protection element region 60 are at the same potential.

When a voltage is applied from the input terminal 63 to the gate electrodes 57, channel regions are formed in the body regions 54 immediately under the gate electrodes 57 between the source regions 55 and drift region 52. This causes electrons to move from the source regions 55 to the drift region 52. A current flow through the substrate as electrons move to the drift region 52 and then to the drain region 51.

In the vertical DMOSFET configuration shown in FIG. 7, the second conductivity type pillar regions 53 and first conductivity type drift region 52 have the same impurity concentration. This causes the pillar regions 53 and drift region 52 to be completely depleted when a reverse bias is applied between the drain and source with the transistor turned off, thus providing a uniform electric field distribution.

The semiconductor configuration shown in FIG. 7, therefore, provides high withstand voltage even if the impurity concentration of the drift region 52 is increased greater than when a super junction structure is not used. Further, because the impurity concentration of the drift region can be increased, a resistance Ron with the transistor turned on can be reduced. Thus, the semiconductor device configured as described above achieves compatibility between high element withstand voltage and low Ron.

SUMMARY OF THE INVENTION

The above vertical DMOSFET having a super junction structure offers a high drain-to-backgate withstand voltage in consideration of the compatibility between element withstand voltage and Ron as described above. However, the gate insulating film is relatively thin. As a result, the gate insulation withstand voltage is low. Also in common vertical power DMOSFETs and DMOSFETs including horizontal DMOSFETs, the drain-to-backgate withstand voltage is high. However, the gate insulating film is relatively thin. Therefore, the gate insulation withstand voltage is low.

In the semiconductor device configured as shown in FIG. 7, the withstand voltage of the drain-to-backgate junction in the ESD protection element region must be equal to or greater than that of the main body Tr region so that the withstand voltage of the DMOSFET in the main body Tr region is not determined by that of the ESD protection element region.

However, the gate insulation withstand voltage of DMOSFETs is lower than the withstand voltage of the drain-to-backgate junction as described above. Therefore, if an ESD protection element region is formed which has a withstand voltage equal to or greater than that of the drain-to-backgate junction of the DMOSFET in the main body Tr region, gate protection may not be achieved as intended.

In light of the foregoing, it is an embodiment of the present invention to provide a semiconductor device having an ESD protection element which can achieve compatibility between high drain-to-backgate withstand voltage and ESD protection of DMOSFET gates.

A semiconductor device according to an embodiment of the present invention includes a main body transistor region and ESD protection element region. The main body transistor region includes drain, drift and body regions. The drain region includes a first conductivity type semiconductor layer. The drift region includes a first conductivity type semiconductor region formed on the drain region. The body regions each include a second conductivity type semiconductor region formed in the drift region. The semiconductor device further includes a gate insulating film and gate electrodes. The gate insulating film is formed on the surfaces of the drift and body regions. The gate electrodes are formed on the surface of the gate insulating film in such a manner as to straddle a part of the surfaces of the body and drift regions. The body regions of the main body transistor region each include a source region and body potential extraction region. The source regions each include a second conductivity type semiconductor region formed on a part of the surface of the body region. The body potential extraction regions each include a first conductivity type impurity diffusion layer. In the main body transistor, channel regions are each formed on a part of the surface of the body region in which the source region is formed and which is covered by the end portion of the gate electrode and the gate electrode. The gate length in the ESD protection element region is equal to or less than twice the channel region length in the main body transistor region.

A semiconductor device manufacturing method according to an embodiment of the present invention forms a drift region by epitaxially growing a first conductivity type semiconductor layer on the main surface of a first conductivity type semiconductor base body. Next, a gate insulating film is formed on the drift layer surface, followed by the formation of gate electrodes on the gate insulating film. Next, a second conductivity type impurity is ion-injected using the formed gate electrodes as masks and thermally diffused to form second conductivity type body regions. Further, a first conductivity type impurity is ion-injected into the formed body regions using the gate electrodes as masks to form source regions in the main body transistor. Still further, source regions and drain regions are formed in the ESD protection element, and a second conductivity type impurity is ion-injected into the body regions to form body potential extraction regions. Finally, in the process step for forming second conductivity type body regions, gate electrodes of the ESD protection element are formed so that the gate length thereof is equal to or less than twice the diffusion length of the ion-injected impurity in the direction of the gate electrodes of the main body transistor.

In the semiconductor device according to an embodiment of the present invention, the gate electrodes of the ESD protection element are formed so that the gate length is equal to or less than the channel length of the main body transistor, allowing for the formation of gate electrodes and body regions having the same configuration as in the main body transistor. This provides a junction withstand voltage of the ESD protection element region equal to or greater than that of the main body transistor. Further, the gate length in the ESD protection element region is equal to or less than twice the channel region length in the main body transistor region, permitting the formation of a GGMOS electrostatic discharge protection element through lateral diffusion of the body region. This provides static discharge protection at a voltage equal to or lower than the gate insulation withstand voltage only when static electricity is applied to the gate.

Further, the semiconductor device manufacturing method according to an embodiment of the present invention allows for the formation of the ESD protection element configured as described above in the same process step as for forming the main body transistor. This eliminates the need for adding a process step for forming the main body transistor, thus allowing for the manufacture of a semiconductor device having an ESD protection element whose junction withstand voltage is equal to or greater than that of the main body transistor.

The semiconductor device according to the embodiments of the present invention allows for the formation of an ESD protection element having the same withstand voltage as the junction of the main body transistor without increasing the number of process steps.

DETAILED DESCRIPTION OF THE PREFERRED EMBODIMENTS

The best embodiments for carrying out the present invention will be described below. However, the present invention is not limited to these embodiments.

The present embodiments will be described in the following order:
1. Embodiment of the semiconductor device
2. Manufacturing method of the semiconductor device according to a first embodiment
3. Another embodiment of the semiconductor device 1. Embodiment of the Semiconductor Device A specific embodiment of the semiconductor device according to an embodiment of the present invention will be described below.

Figure 1:
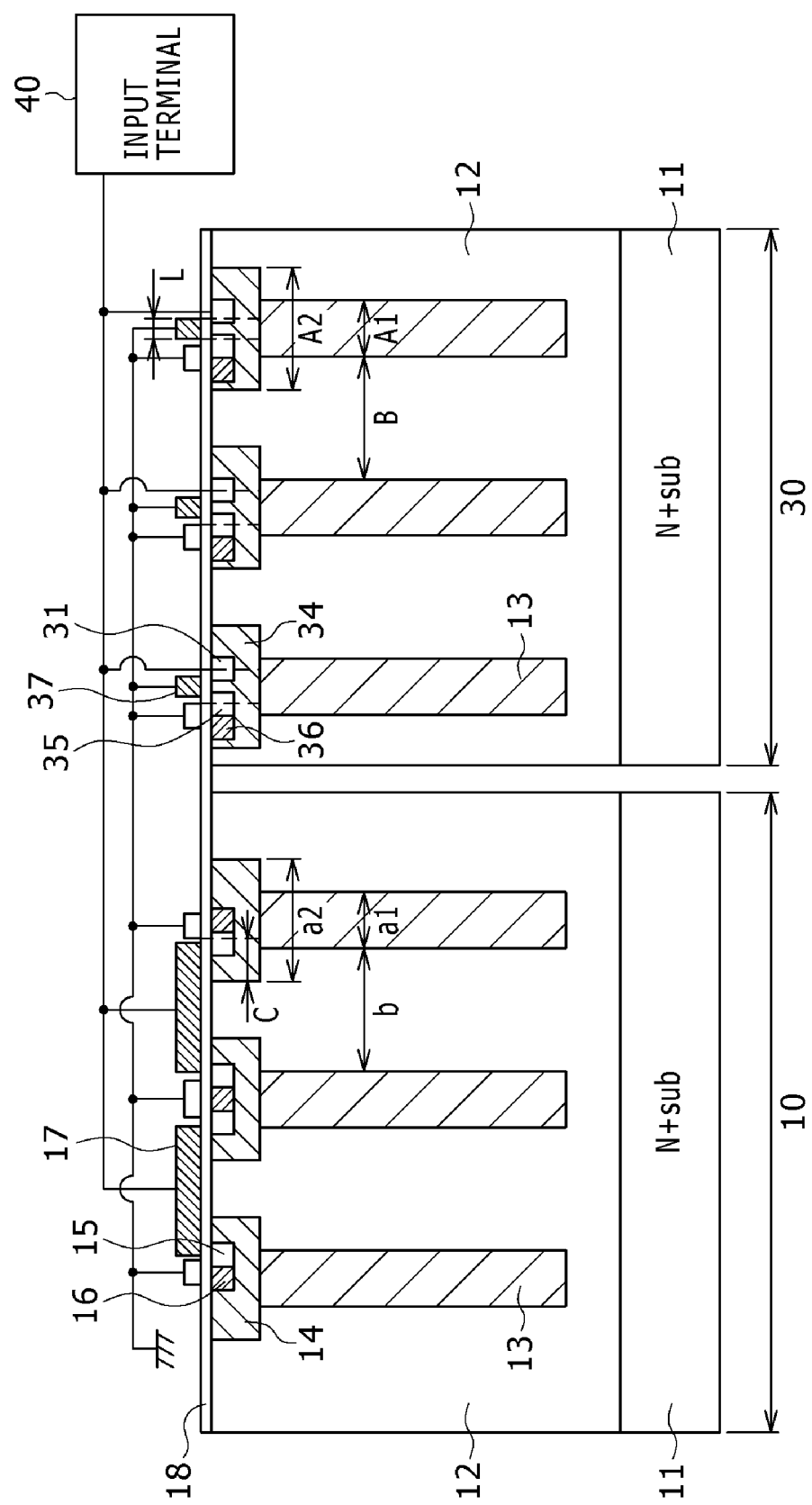
FIG. 1 is a diagram for describing the configuration of a semiconductor device according to an embodiment of the present invention.

FIG. 1 is a schematic configuration diagram of the semiconductor device according to the present invention, illustrating a main body transistor (Tr) region 10 and ESD (Electrostatic Discharge) protection element region 30 in a vertical DMOSFET (Double-diffused Metal Oxide Semiconductor Field Effect Transistor).

The semiconductor device according to the present embodiment has, as a vertical DMOSFET device structure, a so-called super junction structure in which first conductivity type e.g., n-type drift regions and second conductivity type e.g., p-type pillar regions are alternately repeated. A semiconductor device having this structure achieves compatibility between element withstand voltage and low Ron.

In both the main body transistor (Tr) region 10 and ESD protection element region 30, a drift region 12 are formed on the main surface of a drain region 11. The drain regions 11 each include a first conductivity type semiconductor region having a high impurity concentration ($n^+$ type). The drift regions 12 each include a first conductivity type (n type) semiconductor region.

Second conductivity type (p type) pillar regions 13 are formed in each of the drift regions 12. The pillar regions 13 are arranged periodically in the direction approximately parallel to the main surface of each of the drain regions 11. The drift region 12 and pillar regions 13 form a so-called super junction structure. That is, the drift region 12 and pillar regions 13 are adjacent to each other to form p-n junctions.

In the main body Tr region 10, body regions 14 are formed on and in contact with the pillar regions 13. The body regions 14 each include a second conductivity type (p type) semiconductor region. As with the pillar regions 13, the body regions 14 are adjacent to the first conductivity type drift region 12 to form p-n junctions.

Similarly, in the ESD protection element region, body regions 34 are formed on and in contact with the pillar regions 13. The body regions 34 each include a second conductivity type (p type) semiconductor region. As with the pillar regions 13, the body regions 34 are adjacent to the first conductivity type drift region 12 to form p-n junctions.

A gate insulating film 18 is provided on the drift regions 12 and body regions 14 and 34.

In the main body Tr region 10, gate electrodes 17 are formed on the gate insulating film 18 in such a manner as to straddle a part of the body regions 14 and a part of the drift region 12.

Further, on the surfaces of the body regions 14, source regions 15 are selectively formed where the end portions of the gate electrodes 17 and those of the source regions 15 overlap each other. The source regions 55 each include a first conductivity type (n type) semiconductor region. Still further, on the surfaces of the body regions 14, potential extraction regions (backgates) 16 adapted to extract the potentials of the body regions 14 are formed, each adjacent to the source region 15. The potential extraction regions 16 each include a second conductivity type (p type) semiconductor region.

In the vertical DMOSFET according to the present embodiment, channel regions are formed in the body regions 14 where the gate electrodes 17 and body regions 14 in the main body Tr region overlap each other. That is, the length between the source region 15 and drift region 12 under the gate electrode 17 is the effective channel length.

In the ESD protection element region 30, gate electrodes 37 are formed in the second conductivity type body regions 34 on the gate insulating film 18. The gate electrodes 37 are formed so that the gate length thereof is equal to or less than twice the channel length of the main body Tr.

Further, in the ESD protection element region 30, drain regions 31 are formed on the surfaces of the body regions 34. The drain regions 31 each include a first conductivity type semiconductor region. Still further, on the surfaces of the body regions 34, first conductivity type source regions 35 are formed, each opposed to one of the drain regions 31 with the gate electrode 37 provided therebetween. Still further, on the surfaces of the body regions 34, potential extraction regions (backgates) 36 adapted to extract the potentials of the body regions 34 are formed, each adjacent to the source region 35. The potential extraction regions 36 each include a second conductivity type semiconductor region.

In the DMOSFET of the main body Tr region 10, the gate electrodes 17 are formed on the drift region 12 first, followed by the formation of the second conductivity type body regions 14 by ion injection. That is, the second conductivity type body regions 14 are formed by ion-injecting a second conductivity type impurity such as boron (B) into the drift region 12 using the gate electrodes 17 as masks and thermally diffusing the impurity. At this time, the body regions 14 are formed to spread as far as under the gate electrodes 17 as a result of the diffusion of the ion-injected impurity.

In the ESD protection element region 30 as in the main body Tr region 10, the gate electrodes 37 are formed on the drift region 12 first, followed by the ion injection from above the gate electrodes 37 to form the second conductivity type body regions 34.

At the stage following the ion injection, the impurity has been injected into all areas except immediately under the gates, that is, under the gate electrodes 37. Thermal diffusion spreads the impurity layer as far as under the gate electrodes 37. At this time, a gate length L of the gate electrode 37 is equal to or less than twice a channel length c in the main body Tr region 10.

The channel length c in the main body Tr region 10 is where the impurity layer has spread as a result of thermal diffusion following the ion injection using the gate electrodes 17 as masks. Therefore, as a result of the thermal diffusion adapted to form the body regions 14 in the main body Tr region 10, the ion-injected impurity region laterally diffuses at least to the region of the channel length c.

In the ESD protection element region 30, the impurity which has been ion-injected using the gate electrodes 37 as masks laterally diffuses at least to the region of the channel length c.

Because of the ion injection around the gate electrode 37, the body region 34 can extend to immediately under the gate electrode 37 if the gate length L of the gate electrode 37 is equal to or less than twice the channel length c.

This allows for the formation of a GGMOS (Grounded Gate MOS) ESD protection element having the impurity region of the body region 34 extended to under the gate electrode 37.

Further, the semiconductor device according to the present embodiment has an input terminal 40 to ensure that the gate electrodes 17 of the main body Tr region 10 and the drain regions 31 of the ESD protection element region 30 are at the same potential.

When a voltage is applied from the input terminal 40 to the gate electrodes 17, channel regions are formed in the body regions 14 immediately under the gate electrodes 17 between the source regions 15 and drift region 12. This causes electrons to move from the source regions 15 to the drift region 12. A current flows through the substrate as electrons move to the drift region 12 and then to the drain region 11.

In the vertical DMOSFET configuration shown in FIG. 1, the second conductivity type pillar regions 13 and first conductivity type drift region 12 have the same impurity concentration. This causes the pillar regions 13 and drift region 12 to be completely depleted when a reverse bias is applied between the drain and source with the transistor turned off, thus providing a uniform electric field distribution.

The semiconductor device configuration shown in FIG. 1, therefore, provides high withstand voltage even if the impurity concentration of the drift region 12 is increased greater than when a super junction structure is not used. Further, because the impurity concentration of the drift region can be increased, the resistance Ron with the transistor turned on can be reduced. That is, the semiconductor device configured as described above achieves compatibility between high element withstand voltage and low Ron.

Further, in the semiconductor device according to the present embodiment, the drift regions 12 and pillar regions 13 are formed on the first conductivity type semiconductor layers 11. The drift regions 12 each include a first conductivity type epitaxial layer. The pillar regions 13 each include a second conductivity type semiconductor region. Each of the drift regions 12 has a width b, and each of the pillar regions 13 has a width a1. The drift region 12 and pillar region 13 are alternately repeated to form a super junction structure.

Still further, the second conductivity type body regions 14 are formed with a width a2 on the pillar regions 13. DMOSFET channel regions are formed between the gate electrodes 17 and the source regions 15 formed on both ends of each of the gate electrodes 17.

On the other hand, the ESD protection element for DMOSFET is formed in the same process step as for forming the vertical DMOSFET having a super junction structure which makes up the main body Tr. The ESD protection element for DMOSFET has a super junction structure in which the drift region 12 and pillar region 13 are alternately repeated. The drift regions 12 each have a width B and include a first conductivity type epitaxial layer. The second conductivity type pillar regions 13 each have a width A1. The body regions 34 are each formed with a width A2 on the pillar regions 13.

Here, the main body Tr region 10 and ESD protection element region 30 are formed so that the widths b and B are the same, widths a1 and A1 are the same and widths a2 and A2 are the same. Therefore, when a reverse bias is applied between the drain and source with the DMOSFET of the main body Tr turned off, the pillar regions 13 and drift region 12 in the ESD protection element are completely depleted as in the DMOSFET of the main body Tr, thus providing the same withstand voltage.

In the semiconductor device according to the present embodiment, a so-called GGMOS electrostatic discharge protection element is formed in the ESD protection element region 30. This provides the same withstand voltage as the junction between the source 15 and backgate 16 in the DMOSFET of the main body Tr region. Further, a GGMOS protection element is formed as an ESD protection element. This provides static discharge protection at a voltage equal to or lower than the gate insulation withstand voltage only when static electricity is applied to the gate electrodes 37.

Further, the gate electrodes 17 of the main body Tr region 10 and the gate electrodes 37 of the ESD protection element region 30 can be formed in the same process step. Still further, the ion injection and thermal diffusion for the body regions 14 of the main body Tr region 10 and the body regions 34 of the ESD protection element region 30 can be conducted in the same process step. Still further, the drain regions 31, source regions 35 and backgates 36 of the ESD protection element region 30 and the source regions 15 and backgates 16 of the main body Tr region 10 can be formed in the same process step. This allows for the formation of an ESD protection element region in a process step required for the formation of the DMOSFET in the main body Tr region.

As a result, the ESD protection element region 30 having an excellent withstand voltage property can be formed without adding any process step.

2. Manufacturing Method of the Semiconductor Device According to a First Embodiment A detailed description will be given next of an example of manufacturing method of the semiconductor device configured as shown in FIG. 1 with reference to the accompanying drawings. It should be noted that like components as those in FIG. 1 are denoted by the same reference numerals and the detailed description thereof will be omitted.

Figure 2A:
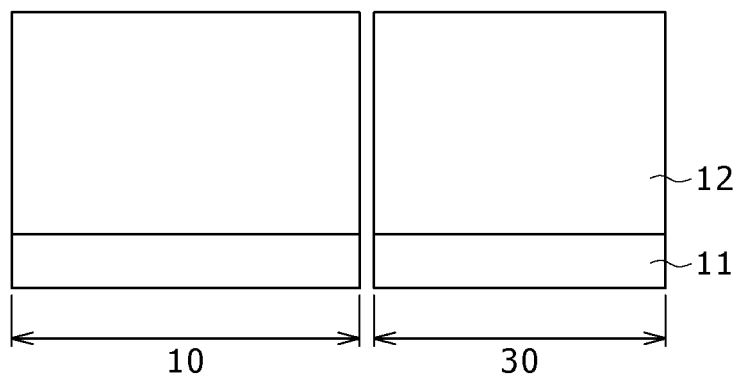
FIGS. 2A to 2D are diagrams for describing a semiconductor device manufacturing method according to the embodiment of the present invention.

First, as illustrated in FIG. 2A, the drift regions 12 are formed by epitaxially growing a semiconductor layer on the main surface of the drain regions 11 while at the same time doping the semiconductor layer, for example, with phosphorus (P). The drain regions 11 each include a first conductivity type semiconductor base body having a high impurity concentration ($n^+$ type). At this time, the semiconductor layer is formed to suit the heights of the top portions of the pillar regions which will be formed in the semiconductor layer.

Figure 2B:
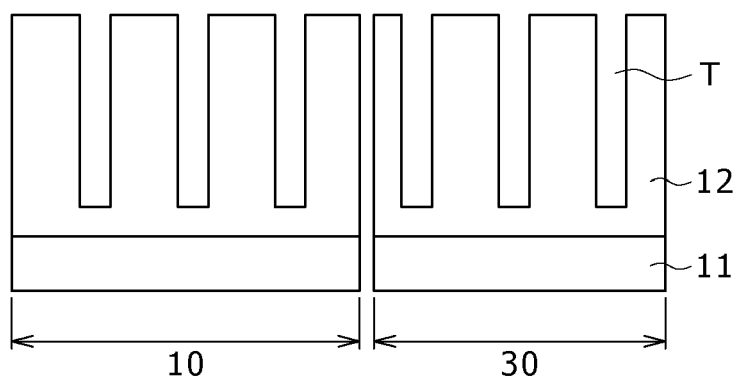
Figure 2C:
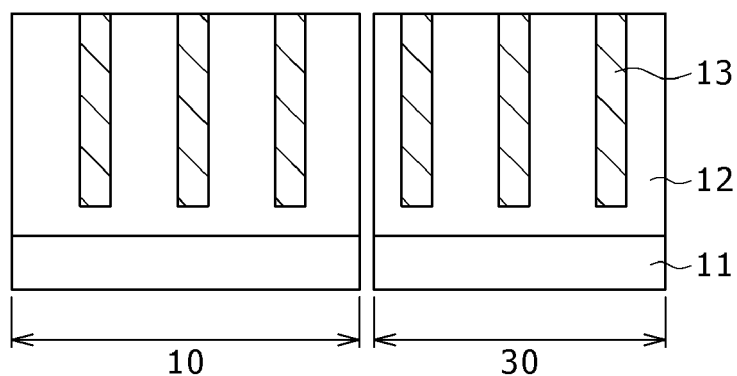

Next, as illustrated in FIG. 2B, trenches T are formed, for example, by RIE (Reactive Ion Etching) where the second conductivity type pillar regions will be formed. Then, as illustrated in FIG. 2C, the trenches T are filled with a second conductivity type semiconductor to form the pillar regions 13.

Figure 2D:
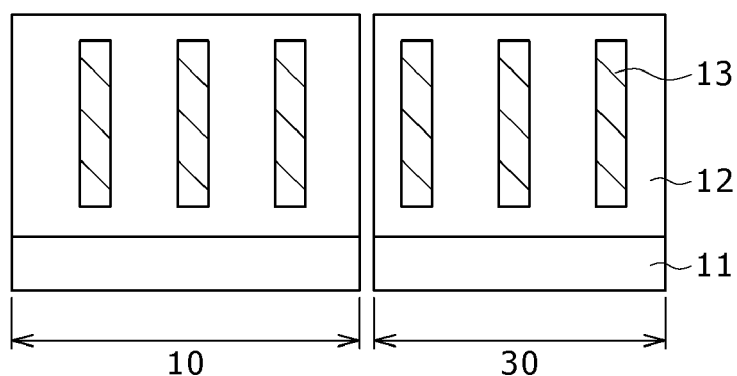

Further, the pillar regions 13 are completely embedded in the drift regions 12 as illustrated in FIG. 2D by epitaxially growing the first conductivity type semiconductor layer in the drift regions.

It should be noted that the drift regions 12 and pillar regions 13 shown in FIG. 2D can be formed by other methods.

Figure 3A:
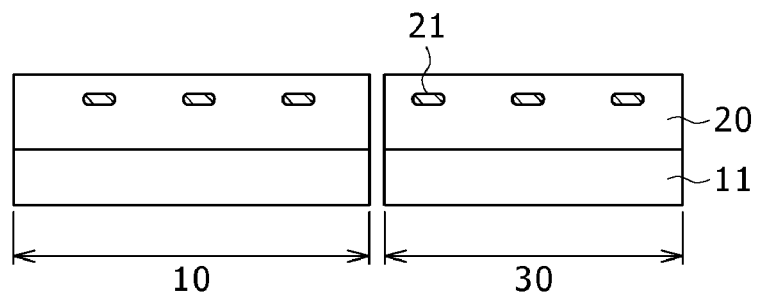
FIGS. 3A to 3C are diagrams for describing the semiconductor device manufacturing method according to the embodiment of the present invention.
Figure 3B:
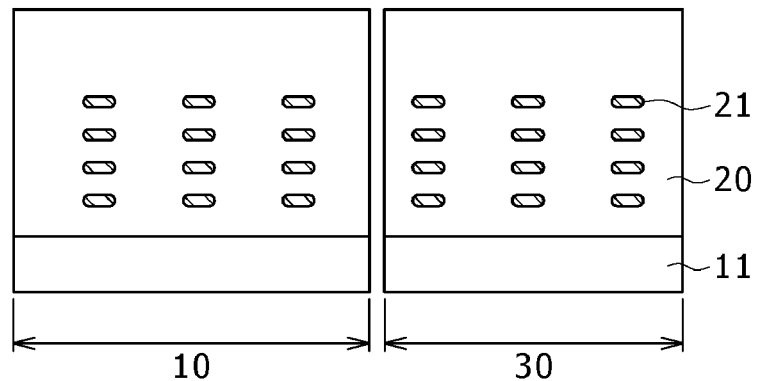

For example, as illustrated in FIG. 3A, a first conductivity type semiconductor layer is epitaxially grown on a first conductivity type semiconductor base body. Next, a second conductivity type impurity such as boron (B) is ion-injected into the positions of this epitaxially grown layer 20 where the pillar regions will be formed, thus forming impurity regions 21. Further, as illustrated in FIG. 3B, the process steps for epitaxially growing a first conductivity type semiconductor layer and forming the impurity regions 21 in the epitaxially grown layer 20 are repeated.

Figure 3C:
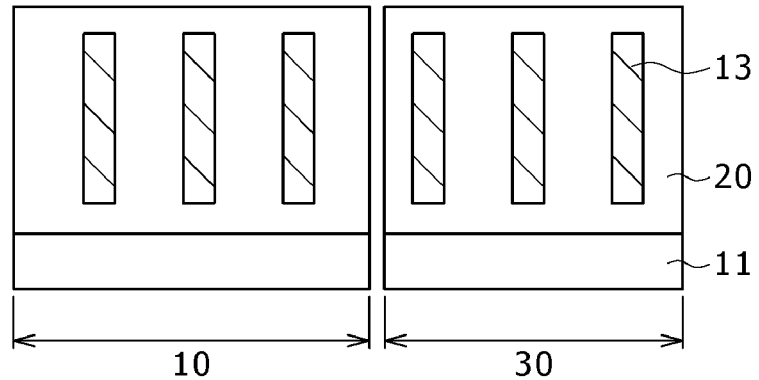

Then, a second conductivity type impurity is thermally diffused, thus forming the pillar regions 13 in the epitaxially grown layer 20 as illustrated in FIG. 3C.

Thus, the drift and pillar regions can be formed by the method described above.

Figure 4A:
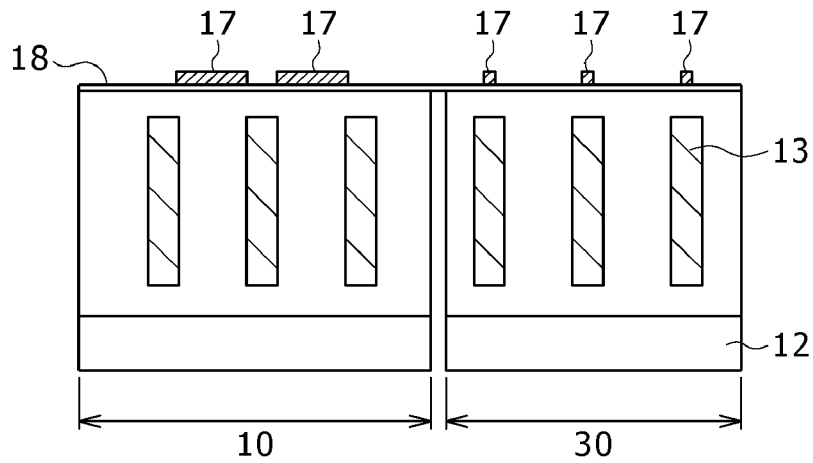
FIGS. 4A to 4C are diagrams for describing the semiconductor device manufacturing method according to the embodiment of the present invention.

Next, as illustrated in FIG. 4A, the gate insulating film 18 is formed on the surface of the epitaxially grown semiconductor layer, followed by the formation of the gate electrodes 17 and 37 on the gate insulating film 18.

In the ESD protection element region 30, the gate electrodes 37 are formed so that the gate length L thereof is equal to or less than twice the channel length c in the main body Tr region.

Figure 4B:
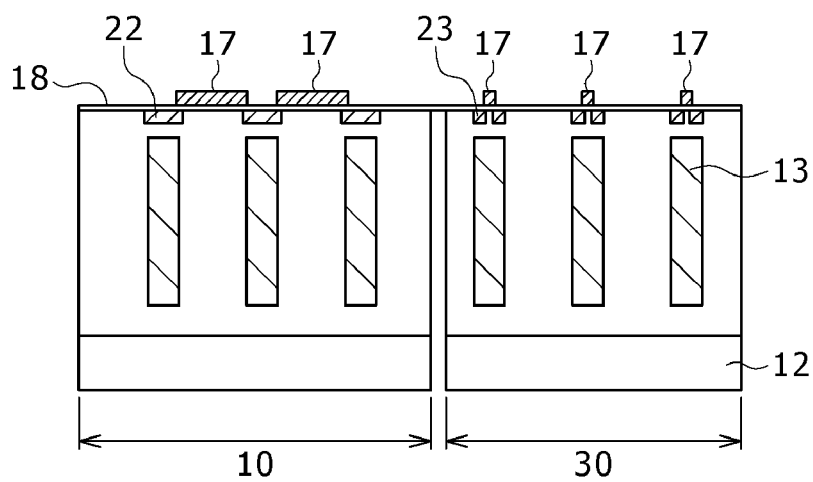
Figure 4C:
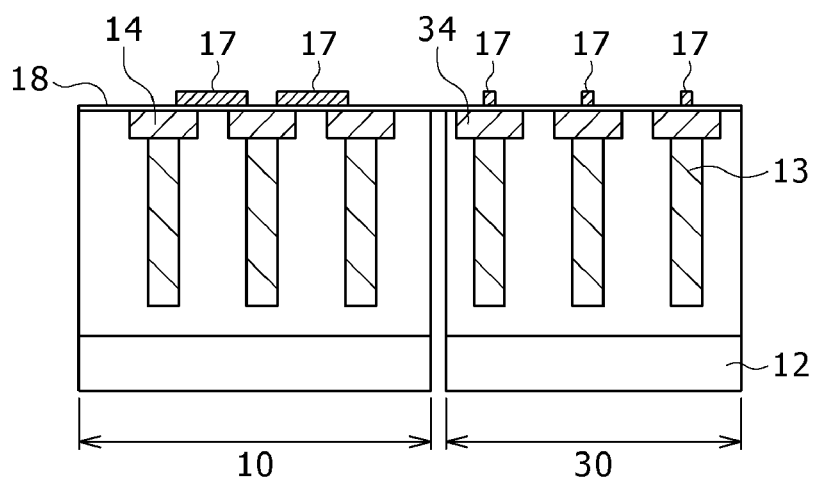

Next, as illustrated in FIG. 4B, a second conductivity type impurity such as boron (B) is ion-injected using the gate electrodes 17 and 37 as masks, thus forming impurity regions 22 and 23. Then, the ion-injected second conductivity type impurity is thermally diffused, thus forming second conductivity type body regions as illustrated in FIG. 4C.

In the ESD protection element region 30, the gate electrodes 37 are formed so that the gate length L thereof is equal to or less than twice the channel length c in the main body Tr region. As a result, the impurity laterally diffuses as far as under the gate electrodes 37, allowing for the formation of the body regions 34.

Further, the impurity diffuses laterally because of the thermal diffusion adapted to form the body regions 14 and 34. This causes the diffused impurity to form channel regions under the gate electrodes 17 in the main body Tr region.

Figure 5A:
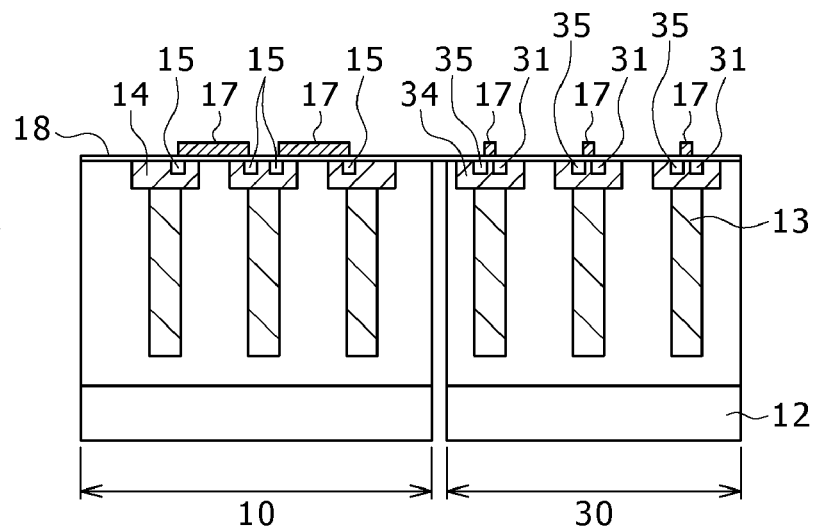
FIGS. 5A and 5B are diagrams for describing a semiconductor device manufacturing method according to the embodiment of the present invention.

Next, as illustrated in FIG. 5A, a first conductivity type impurity such as phosphorus (P) is ion-injected into given positions of the body regions 14 and 34 using the gate electrodes 17 and 37 as masks, followed by thermal diffusion. This process step forms not only the source regions 15 in the body regions of the main body Tr region and the source regions 31 and drain regions 35 in the ESD protection element region.

Figure 5B:
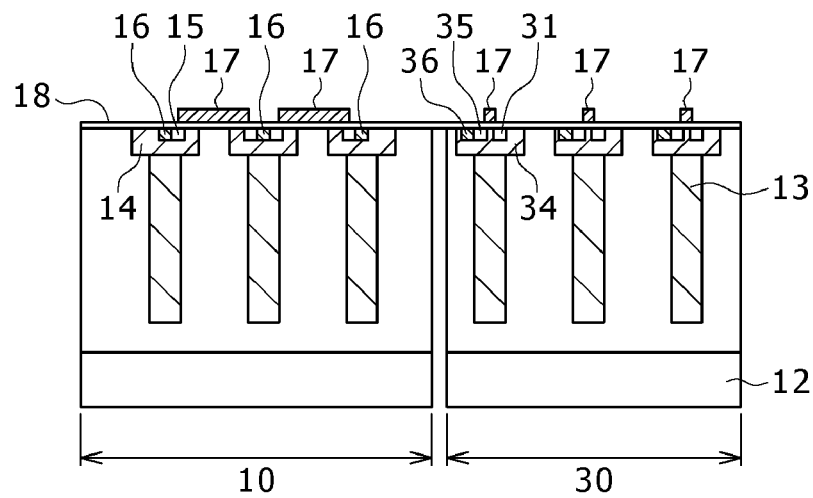

Further, as illustrated in FIG. 5B, a second conductivity type impurity such as boron (B) is ion-injected into the body regions 14 and 34, thus forming the potential extraction regions (backgates) 16 adapted to extract the potentials of the body regions 14 in the main body Tr region 10. The backgates 16 each include a second conductivity type semiconductor region. The potential extraction regions (backgates) 36 are also formed which are adapted to extract the potentials of the body regions 34 in the ESD protection element region. The backgates 36 each include a second conductivity type semiconductor region.

In the above manufacturing method, the process step for ion-injecting a second conductivity type impurity to form the body regions 14 and 34 can form the same regions 14 and 34 in a self-aligned manner by ion-injecting the impurity using the gate electrodes 17 and 37 as masks. Similarly, the process step for ion-injecting a first conductivity type impurity to form the source regions 15 and 31 and drain regions 35 in the body regions 14 and 34 can form the same regions 15, 31 and 35 in a self-aligned manner by ion-injecting the impurity using the gate electrodes 17 and 37 as masks. This permits ion injection with high accuracy where the gate electrodes 17 and 37 are used as masks even if mask alignment is conducted with low accuracy.

3. Another Embodiment of the Semiconductor Device

Figure 6:
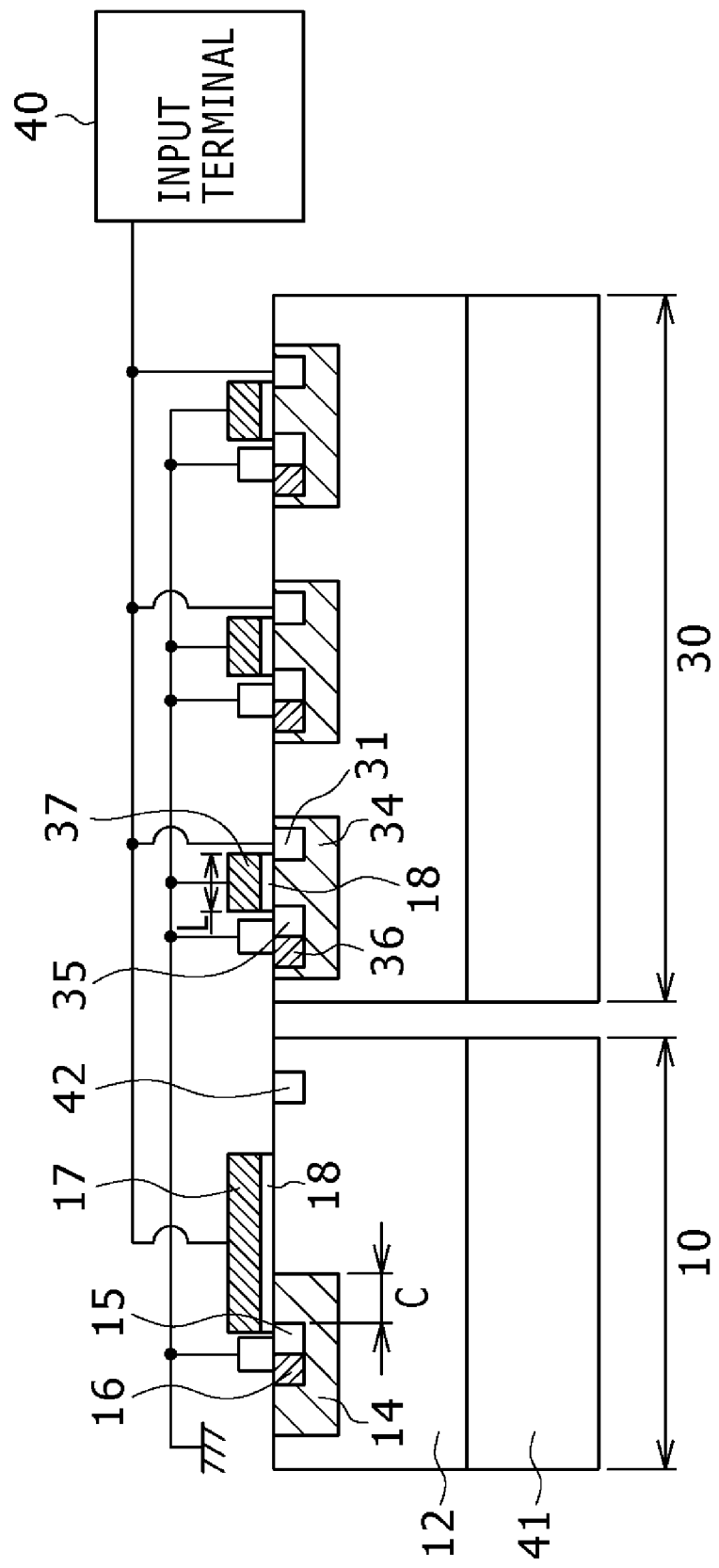
FIG. 6 is a diagram for describing the configuration of a semiconductor device according to another embodiment of the present invention.
Figure 7:
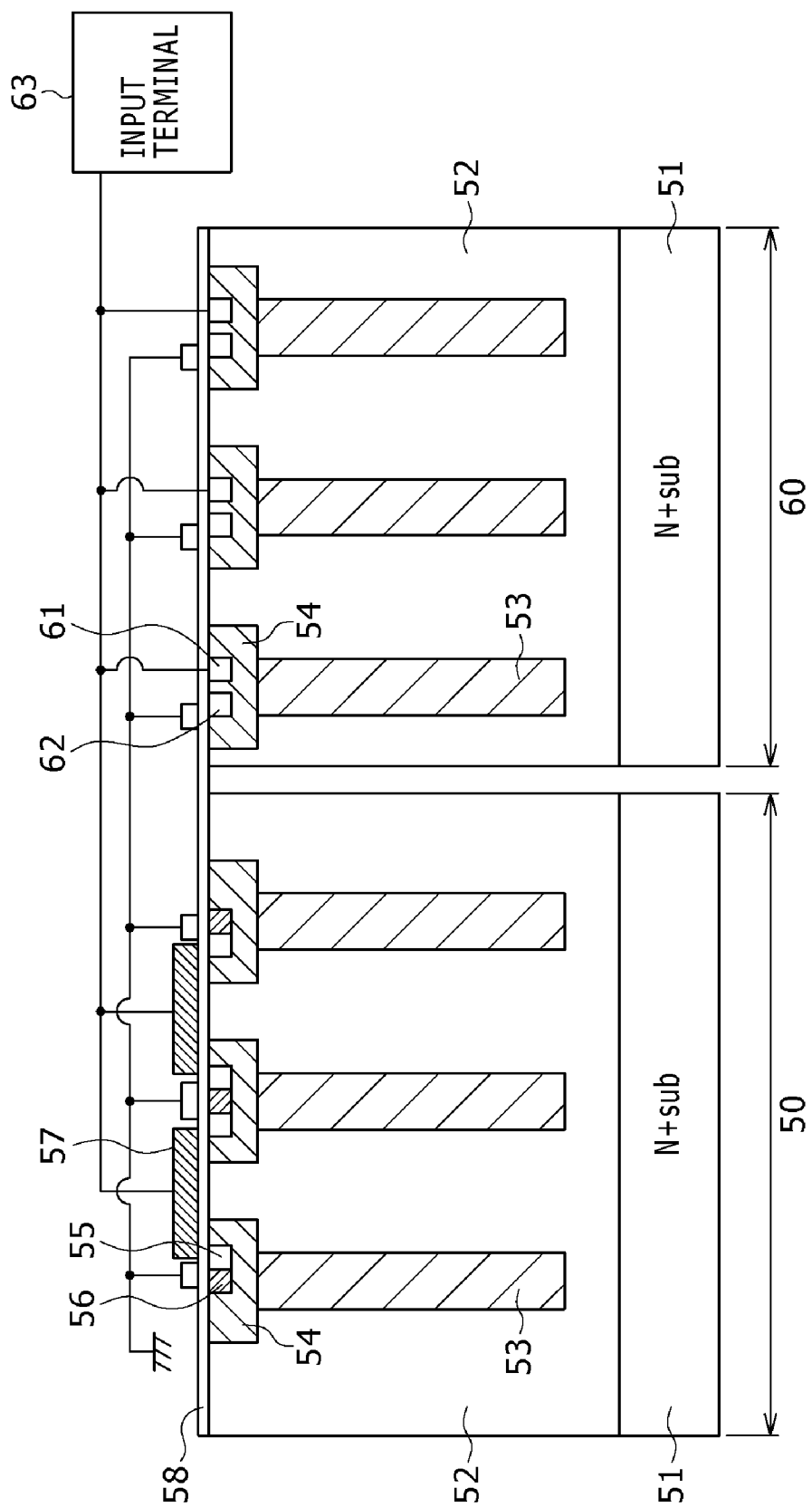
FIG. 7 is a diagram for describing the configuration of a semiconductor device of the past.

In the above embodiment, the semiconductor device according to an embodiment of the present invention has been described with reference to the combination of a vertical DMOSFET and ESD protection element for DMOSFET both having a super junction structure. However, a common vertical or horizontal DMOSFET may be used rather than a vertical DMOSFET having a super junction structure. FIG. 6 illustrates, as an example, the configuration of a semiconductor device using a horizontal DMOSFET. It should be noted that, in the description given below, like components as those in FIG. 1 are denoted by the same reference numerals and the detailed description thereof will be omitted.

In both the main body Tr region 10 and ESD protection element region 30, the drift regions 12 are formed on second conductivity type (p type) semiconductor base bodies 41. The drift regions 12 each include a first conductivity type (n type) epitaxially grown layer. Further, the gate electrode 17 is formed above the drift layer 12 via the gate insulating film 18.

In the main body Tr region 10, the body region 14 is formed on the surface of the drift region 12 which includes an epitaxially grown layer. Further, a second conductivity type (p type) drain region 42 is formed to be opposed to the body region 14 with a gate electrode provided therebetween.

On the surface of the body region 14, the source region 15 is selectively formed where the end portion of the gate electrode 17 and that of the source region 15 overlap each other. The source region 15 includes a first conductivity type semiconductor region. Further, on the surface of the body region 14, the potential extraction region (backgate) 16 adapted to extract the potential of the body region 14 is formed adjacent to the source region 15. The potential extraction region 16 includes a second conductivity type semiconductor region.

Still further, a channel region is formed at the position of each of the body regions 14 where the gate 17 and body region 14 overlap each other in the main body Tr region 10.

When a voltage is applied from the input terminal 40 to the gate electrode 17, a channel region is formed in the body region 14 immediately under the gate electrode 17 between the source region 15 and drift region 12. This causes electrons to move from the source regions 15 to the drift region 12. A current flows through the substrate as electrons move to the drift region 12 and then to the drain region 42.

On the other hand, the ESD protection element region 30 has the same configuration as the semiconductor device shown in FIG. 1. Here, the gate length L of the gate electrodes 37 is also equal to or less than twice the channel length c in the main body Tr region 10. This allows for the formation of a GGMOS ESD protection element having the impurity region of the body region 34 extended to under the gate electrode 37.

Although, in the above embodiments of the semiconductor device, a body region of a first conductivity type such as p type is formed in a drift region which includes an epitaxially grown layer of a first conductivity type such as n type, n and p types may be reversed.

It should be noted that the present invention is not limited to the configurations described in the above embodiments but may be modified or altered in various ways without departing from the spirit and scope of the present invention.

The present application contains subject matter related to that disclosed in Japanese Priority Patent Application JP 2008-222810 filed in the Japan Patent Office on Aug. 29, 2008, the entire content of which is hereby incorporated by reference.

What is claimed is:

1. A semiconductor device comprising:
a main body transistor region; and
an electrostatic discharge protection element region, wherein
the main body transistor region includes,
a drain region which includes a first conductivity type semiconductor layer;
a drift region which includes a first conductivity type semiconductor region formed on the drain region;
body regions each of which includes a second conductivity type semiconductor region formed in the drift region;
a gate insulating film formed on the surfaces of the drift region and body regions;
gate electrodes formed on the gate insulating film in such a manner as to straddle a part of the surfaces of the body regions and a part of the surface of the drift region;
source regions each of which includes a first conductivity type semiconductor region formed on a part of the surface of the body region at the end portion of the gate electrode;
channel regions each formed on a part of the surface of the body region in which the source region is formed and which is covered by the end portion of the gate electrode and the gate electrode; and
potential extraction regions, adapted to extract the potentials of the body regions, each of which includes a second conductivity type impurity diffusion layer formed on the surface of the body region, and
the electrostatic discharge protection element region includes,
the body regions having the same configuration as those in the main body transistor region;
the gate insulating film formed on the surfaces of the body regions;
the gate electrodes formed on the gate insulating film on a part of the surfaces of the body regions;
source regions and drain regions, the source regions each including a first conductivity type semiconductor region formed on a part of the surface of the body region at the end portion of the gate electrode, and the drain regions each including a first conductivity type semiconductor region; and potential extraction regions, adapted to extract the potentials of the body regions, each of which includes a second conductivity type semiconductor region formed on a part of the surface of the body region, and a gate length in the electrostatic discharge protection element region is equal to or less than twice a channel length in the main body transistor region.

2. The semiconductor device of claim 1 comprising:

in the main body transistor region and electrostatic discharge protection element region, second conductivity type pillar regions which are arranged periodically in the direction approximately parallel to the main surface of the drain region.

\* \* \* \* \*